United States Patent [19]

McAdams

[11] Patent Number: 5,519,666
[45] Date of Patent: May 21, 1996

[54] APPARATUS AND METHOD FOR AN ADDRESS TRANSITION DETECTOR

[75] Inventor: Hugh P. McAdams, McKinney, Tex.

[73] Assignee: Texas Instruments Incorporated, Dallas, Tex.

[21] Appl. No.: 346,728

[22] Filed: Nov. 30, 1994

[51] Int. Cl.$^6$ .................................................. G11C 11/415
[52] U.S. Cl. ...................... 365/233.5; 365/206; 327/161; 327/263; 327/31; 327/24
[58] Field of Search .............................. 365/233.5, 206; 327/18, 24, 28, 31, 34, 153, 161, 263

[56] References Cited

U.S. PATENT DOCUMENTS

| | | | |
|---|---|---|---|
| 5,072,131 | 12/1991 | Nakano | 365/233.5 |
| 5,319,607 | 6/1994 | Fujii et al. | 365/233.5 |

Primary Examiner—Tan T. Nguyen
Attorney, Agent, or Firm—William W. Holloway; Leo Heiting; Rich Donaldson

[57] ABSTRACT

An address transition detector stores a first output signal on an output terminal for a first predetermined period of time in response to an initial edge of an internal address signal pulse. The address transition detector stores a second output signal on the output terminal for a second predetermined period of time in response to the trailing edge of the internal address signal pulse. When the trailing edge of the internal address signal pulse is delayed from the leading edge of the internal address signal pulse by an amount greater than the first predetermined period, then output signal consists of two pulses. When the trailing edge of the internal address signal pulse is delayed from the leading edge by a time less than the first predetermined period, then the signal on the output terminal is a single expanded signal. Typically, the first and second predetermined periods are equal.

15 Claims, 3 Drawing Sheets

APPARATUS AND METHOD FOR AN ADDRESS TRANSITION DETECTOR

BACKGROUND OF THE INVENTION

1. Field of the Invention

This invention relates generally to apparatus associated with an integrated circuit memory array and, more particularly, to the detectors of address signals, typically referred to as address transition detectors. The address transition detectors facilitate the random access of integrated circuit memory locations.

2. Description of the Related Art

Address transition detectors are typically used in semiconductor memory products to speed up the random access of data. By internally precharging and equalizing heavily capacitively loaded data input/output lines (i.e., lines which are internal to the integrated circuit chip) whenever new data is to be retrieved from the memory array, the time required to retrieve the data is reduced. In most memory systems, the procedure for withdrawing data from the memory array begins with the application of new memory array address signals on the system address bus. The memory device, in response to the application of these signals, internally decodes the address of the requested data and applies the correct information signals on the data bus some period of time after the address has been decoded. It will be clear that the an address signal (transition) is present on at least one of the address lines if new information is requested.

Several problems arise in the design and use of address transition detectors (ATD) to identify the presence of an address signal on the system bus. The speed with which the address transition detectors detect an address transition and generate a usable signal internally is one the important components in the effort to reduce the access time for retrieval of information from the memory device. In addition, the ability of the address transition detector to respond properly to spurious address line noise is a problem that must be considered in the design of the these devices.

The ideal response of the address transition detector unit to a noise transient less than the internal address signal pulse width is shown in FIG. 1. A very small pulse applied to the input of the address transition detector provides an output signal from the address transition detector which is of the form required by the internal summing circuit. (The internal summing circuit referred to here takes the results of multiple address transition detectors and sums them together to provide a single signal pulse in the event of the detection of one or more address transitions.) As the input address signal pulse increases in width, i.e., the interval between the leading edge 11 of the input pulse and the trailing edge 12–15 increases, the interval between the leading edge 10' and the trailing edges 11'–15' of the output pulse from the address transition detector unit similarly increases. A constant time delay is provided between the trailing edge of the input address pulse and the trailing edge of the output signal of the address transition detector unit.

In the past, a number of circuit implementations have been used for the address transition detector. However, most have failed to exhibit the desired response to very narrow noise transients. The failure of these implementations is due to the number of buffer stages between the internal address signal and the output of the address transition detector. The more stages of inverting amplifiers or gates in the signal path, the wider the disturbing transient must be before the address transition detector unit can respond properly. Other approaches have failed to exhibit the desired relationship between the trailing edge of the address signal and the trailing edge of the output signal from the address transition detection. This failure has led to improper circuit operation due to internal timing skews between the arrival of the data at the input of amplifiers in the data path and the activation of those amplifiers.

A need has therefore been felt for an address transition detection which can provide a constant detail between the trailing edge of an address signal and the output signal from an address transition detector unit. In addition, the address transition detector unit should be responsive to narrow pulses which are applied thereto.

SUMMARY OF THE INVENTION

The aforementioned and other features are provided according to the present invention, by an address transition detector which generates and stores an output signal upon detection of the leading edge of an internal address transition. Upon detection of the trailing edge of the address signal, the stored output signal is discharged. The address transition detector has a first set of two signal paths which provide an output signal in response to the leading edge of a transition of the signal applied to the input terminal, the polarity of the transition determining the signal path providing the output signal. The output signal is trapped on the output terminal. A second set of signal paths, wherein each signal path includes a delay unit, responds to the trailing edge transition of the address signal and discharges the trapped signal on the output terminal after a predetermined period of time.

DESCRIPTION OF THE PREFERRED EMBODIMENT(S)

Figure 1:
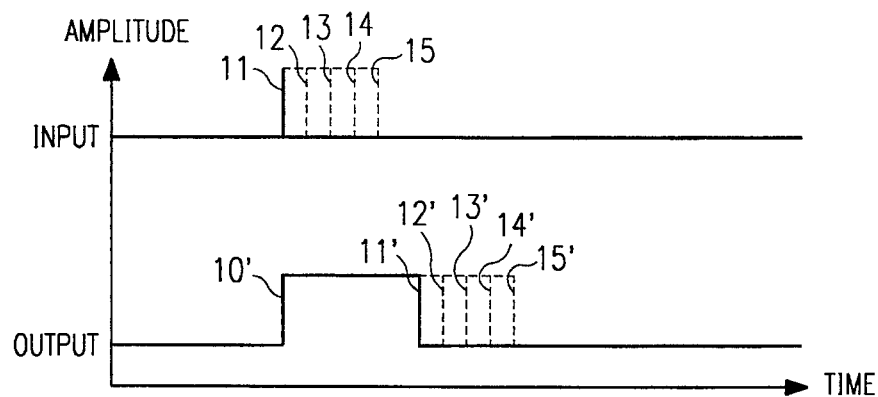
FIG. 1 illustrates the relationship between the trailing edge of an address signal and the output signal of the ideal address transition unit.

1. Detailed Description of the Drawings FIG. 1 has been described with relationship to the related art.

Figure 2:
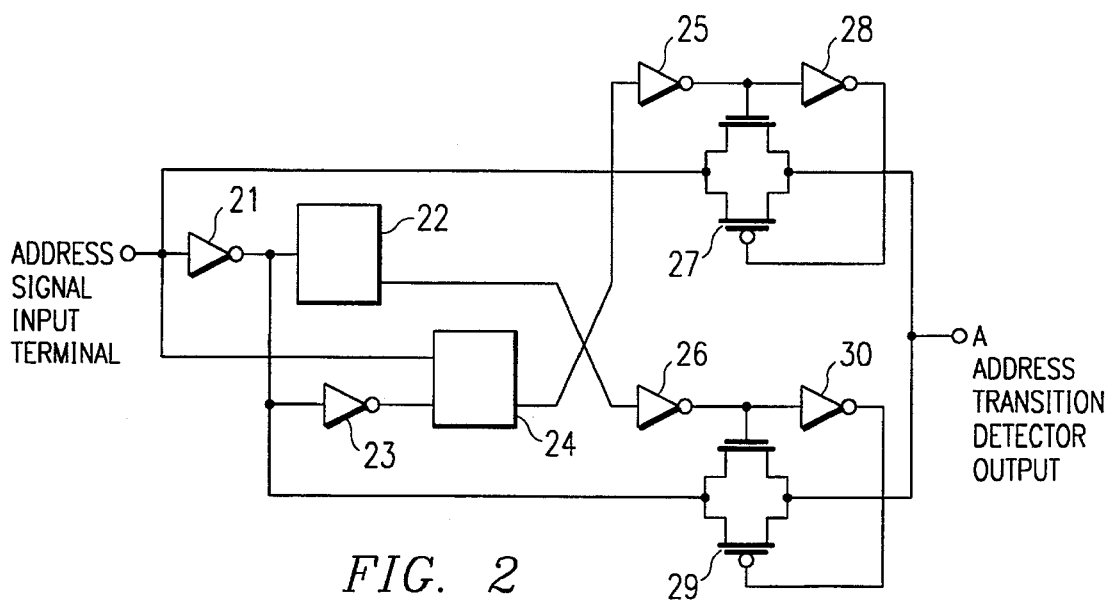
FIG. 2 is a circuit diagram for an address transition detector unit according to the present invention.

Referring next to FIG. 2, the circuit diagram of the address transition detector unit according to the present invention. An input terminal of the address transition detector is coupled to an input terminal of inverting amplifier 21, is coupled to an input terminal of pass gate 27, and is coupled to a second terminal of delay unit 24. An output terminal of inverting amplifier 21 is coupled to an input terminal of delay unit 22, to an input terminal of inverter amplifier 23, and to an input terminal of pass gate 29. An output terminal of inverting amplifier 23 is coupled to a first input terminal of delay unit 24. An output terminal of delay unit 24 is coupled to an input terminal of inverting amplifier 25. An output terminal of inverting amplifier 25 is coupled to a first control terminal of pass gate 27 and is coupled through inverting amplifier 28 to a second control terminal of pass gate 27. The output terminal of delay unit 22 is coupled to an input terminal of inverting amplifier 26. An output terminal of inverting amplifier 26 is coupled to a first control terminal of pass gate 29 and through inverting amplifier 30 to a second control terminal of pass gate 29. The output terminal of pass gate 27 and the output terminal of pass gate 29 are coupled together to form the output terminal of the address transition detector.

Figure 3:
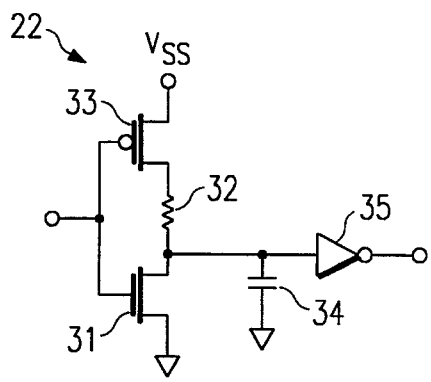
FIG. 3 is a circuit diagram of an embodiment of a first signal delay unit according to the present invention.

Referring to FIG. 3, the implementation of the delay unit 22, according to the preferred embodiment of the present invention, is shown. An input terminal is coupled to a gate of n-channel transistor 31 and to a gate terminal of p-channel transistor 33. The source of transistor 31 is coupled to ground, while the drain of transistor 31 is coupled to a first terminal of capacitor 34 (a second terminal of capacitor 34 being coupled to ground), to an input terminal of inverting amplifier 35, through resistor 32 to a drain terminal of transistor 33. The source terminal of transistor 33 is coupled the supply voltage. The output of inverting amplifier 35 is the output terminal of the delay unit 22.

Figure 4:
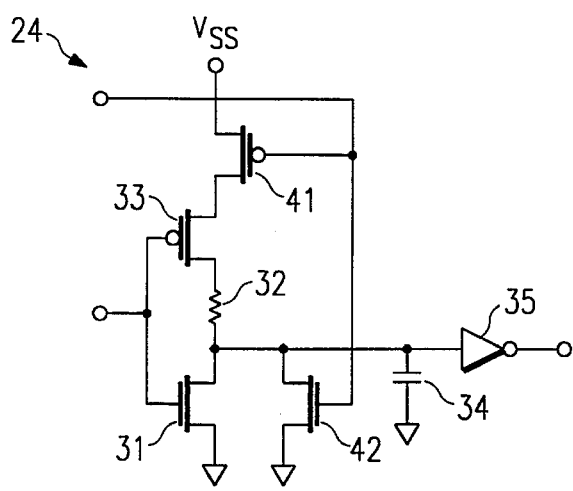
FIG. 4 is a circuit diagram of an embodiment of a second signal delay unit according to the present invention.

Referring to FIG. 4, the implementation of the delay unit 24, according to the preferred embodiment of the present invention is shown. The structure of the delay unit 22 shown in FIG. 3 has been generally retained. To delay unit 22, a p-channel transistor 41 has been coupled between the source of transistor 33 and the supply terminal, a drain of transistor 41 being coupled to the source of transistor 33. The gate of transistor 41 is coupled to a second input terminal. The second input terminal is also coupled to a gate terminal of n-channel transistor 42. A source terminal of n-channel transistor 42 is coupled to ground, while a drain terminal of transistor 42 is coupled to the input terminal of inverting amplifier 35.

Figure 5:
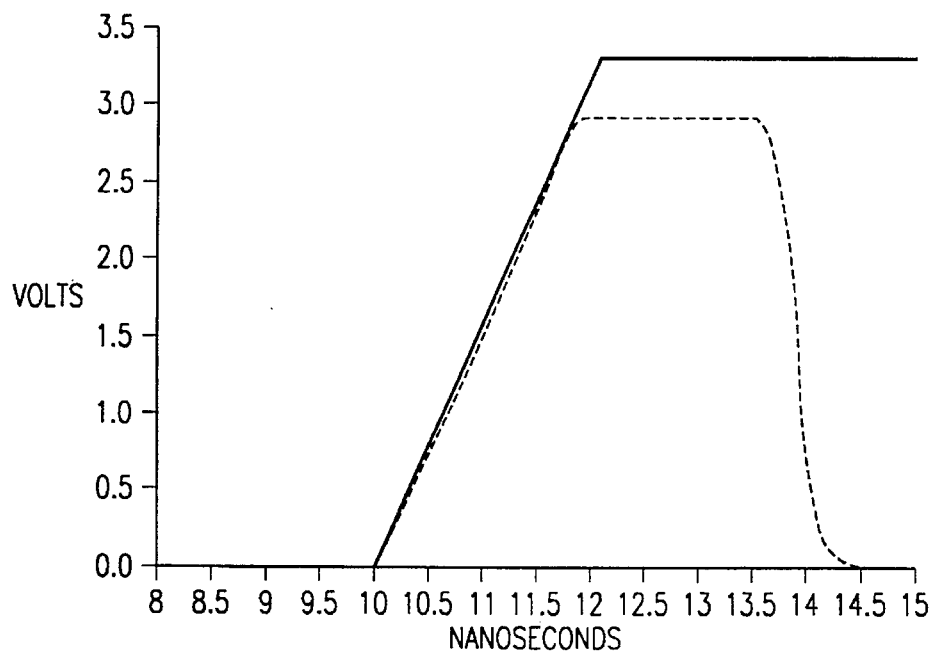
FIG. 5 is a plot of a response of the address transition detector circuit of the present invention to a high to low transition according to a simulation program.
Figure 6:
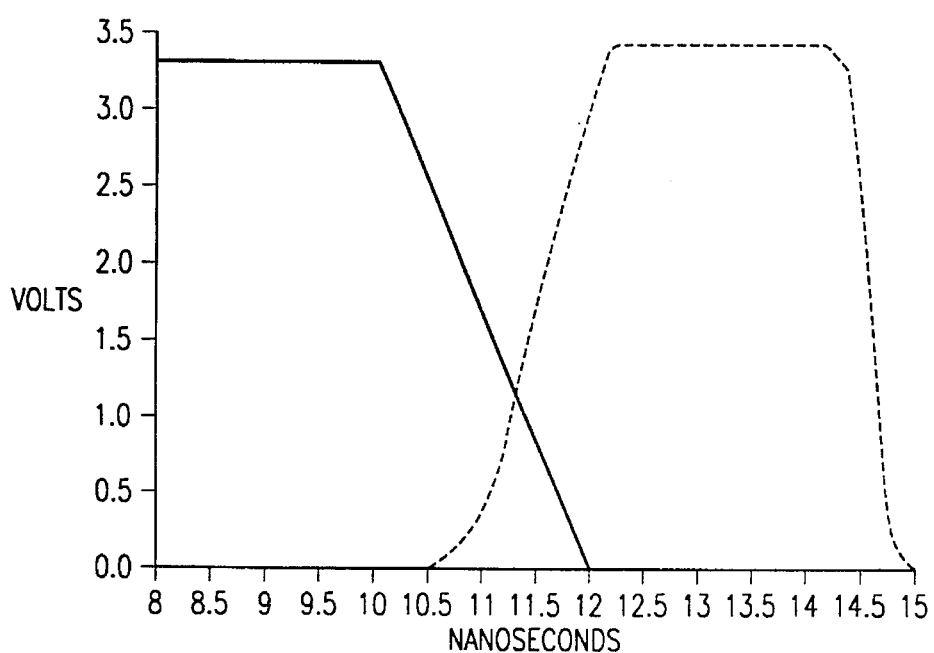
FIG. 6 is a plot of a response of the address transition detector circuit of the present invention to a low to high transition according to a simulation program.
Figure 7:
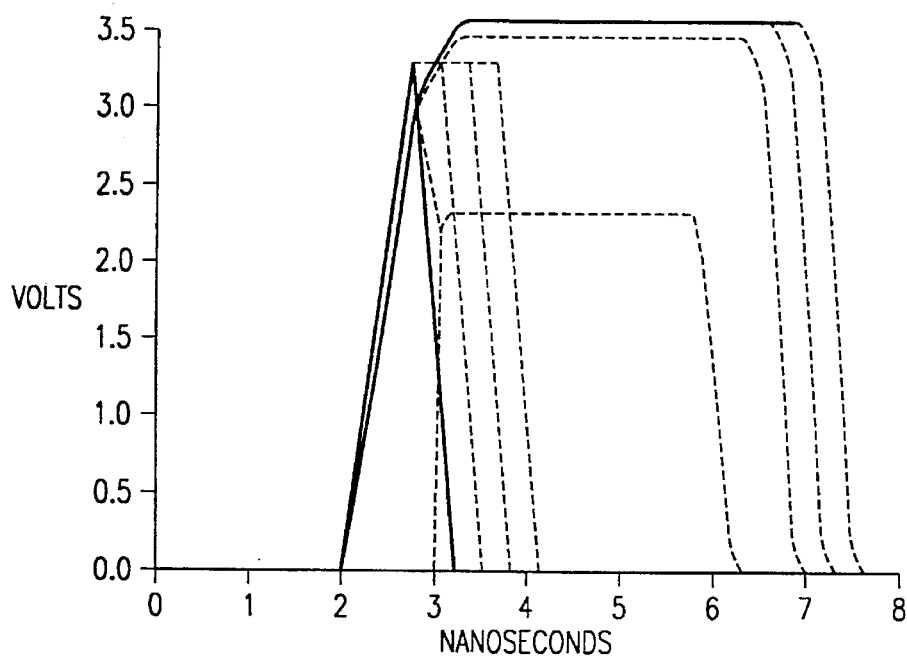
FIG. 7 shows plots of responses of the address transition detector circuit of the present invention to various positive transition pulse widths.

Referring to FIG. 5, a simulation of the response of the address transition detection unit to a high to low transition is illustrated. In FIG. 6, a simulation of the response of the address transition detector unit to a low to high transition is shown. FIG. 7 shows simulated the response of the address transition detector unit of the present invention to varying positive transient pulse widths, while FIG. 8 shows simulation curves for the response of the address transition detector unit to varying negative transient pulses.

2. Operation of the Preferred Embodiment(s)

A low to high transition of the address signal applied to the address transition detector input terminal is transmitted through pass gate 27 directly to the address transition detector output terminal. Simultaneously, the address signal is applied to delay unit 24. Delay unit 24 is designed to delay only on negative transitions, therefore, the positive transition of the leading edge of the address signal is transmitted immediately to the input terminal of inverter amplifier 25. The signal passes through inverter amplifier 25 and though inverter amplifier 28, the signal turning off pass gate 27 thereby and trapping the signal stored on the output terminal. The high level on the output terminal will remain until removed by a subsequent circuit activity. When the address signal is a short duration pulse, the stored output signal is discharged through pass gate 27 after delay unit 24 has timed out (i.e., as a result of the negative transition trailing edge of the address signal). When the pulse width of the address signal is longer in duration, then the path to provide the discharge for the output signal from the address transition detector is through the pass gate 29 after delay unit 22 has timed out from the negative transition at the output terminal of inverter amplifier 21. For a positive leading edge transition of the address signal, pass gate 29 is off during the initial negative transition at the output terminal of the inverting amplifier 21. There is no conflict, therefore, with pass gate 27 and pass gate 29 being on when the leading edge of the address signal goes high. For the negative transitions of the address signal, the input must be inverted by inverter amplifier 21 before the positive transition at the output terminal of the amplifier 21 is passed through pass gate 29 to the output terminal. Delay unit 22, inverter amplifier 26 and inverting amplifier 30 perform to trap and discharge the positive transition at the output of inverting amplifier 21. For a negative transition of the address signal, pass gate 27 is off during the initial transition so that, again, no conflict between pass gate 27 and pass gate 29 exists. As will be clear, the address transition detector will respond to transitions of either polarity with a positive output pulse.

Figure 8:
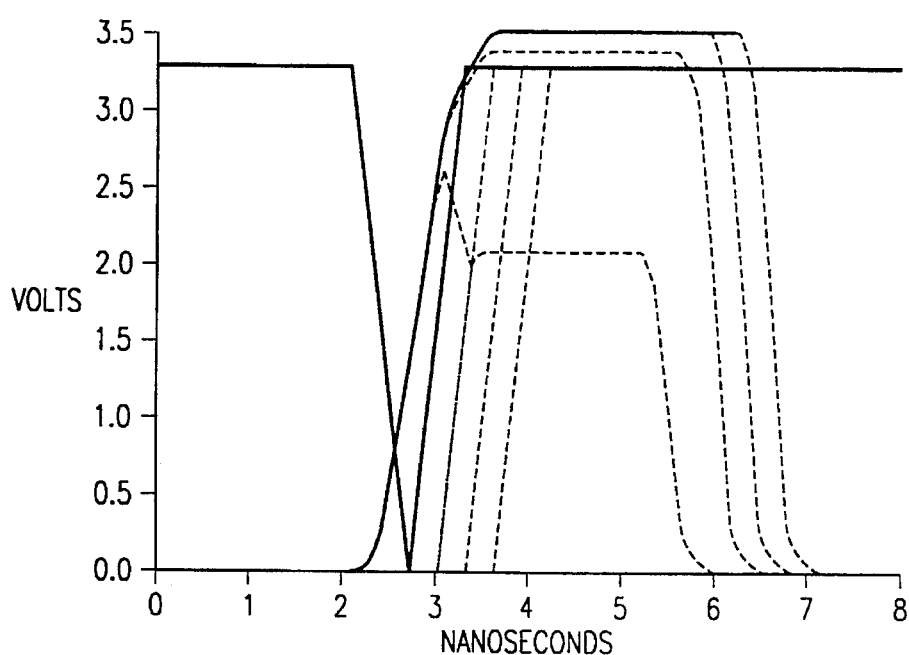
FIG. 8 show plots of responses of the address transition detector circuit of the present invention to various negative transition pulse widths.

Referring to the simulation graphs and particularly FIG. 7 and FIG. 8, the address transition detector responds to input signals having a pulse width of less than 2 nanoseconds. Thus, the address transition detector can process signals having an extremely short duration, a feature achieved with difficulty in previous detectors.

Viewed in another manner, the address transition detector generates a first output signal pulse as a result of the leading edge of the address signal and a second output signal pulse as a result of the trailing edge of the address signal. When the leading and trailing edges of the address signal are sufficiently close (in time), the two output signals generated by the address transition detector will merge and become a single output signal. The address transition detector therefore responds to an address signal by generating an output signal pulse having at least predetermined minimum parameters.

While the invention has been described with particular reference to the preferred embodiment, it will be understood by those skilled in the art that various changes may be made and equivalents substituted for elements of the preferred embodiment without departing from the invention. For example, the present invention has been described as useful for the identification of address transitions and the generation of signals which are related to the transitions. However, the disclosed technique can have wider application to the generation of signal pulses which have a leading edge generally coincident with the leading edge of and incoming pulse, but having the trailing edge of the output pulse delayed by a predetermined amount from the leading edge of the input pulse signal. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. An address transition detector comprising:

a first pass gate coupled between an input terminal of said address transition detector unit and an output terminal of said address transition detection unit;

a first delay unit coupled between an input terminal of said address transition detector unit and control terminals of said first pass gate, said first delay unit providing a first predetermined delay to a negative transition signal applied to said input terminal;

a second pass gate coupled between said input terminal and said output terminal; and a second delay unit coupled between said input terminal and control terminals of said second pass gate, said second delay unit providing a second predetermined delay to a positive transition signal applied to said input terminal.

2. The address transition detector unit of claim 1 wherein said address transition detector unit is implemented in integrated circuit technology.

3. The address transition detector unit of claim 2 further comprising;

a first inverting amplifier coupled between said input terminal and said second delay unit; and a second inverting amplifier coupled between said first inverting amplifier and said first delay unit.

4. The address transition detector unit of claim 3 wherein said first pass gate discharges a signal resulting from a short low-high-low duration input pulse, said second pass gate discharges a signal resulting from a long low-high-low duration input pulse.

5. The address transition detector unit of claim 2 wherein said first and said second predetermined delays are equal.

6. The method of detecting address transition signals, said method comprising the steps of:

transmitting a leading edge transition of an input signal to an output terminal;

trapping an output signal resulting from the transmitting of said leading edge transition on said output terminal; and returning said output signal on an output terminal to its original value after a predetermined time.

7. The method of claim 6 wherein said transmitting state includes the step of transmitting said leading edge transition through a first pass gate; and wherein said trapping step includes the step of disabling the conducting state of said first pass gate.

8. The method of claim 7 wherein said returning step includes the step of enabling a conducting state of said pass gate by output signals from a first delay unit responding to a trailing edge of said address transition, said output signals of said delay unit being generated after said predetermined period of time.

9. The method of claim 8 wherein said returning step includes the step of, for signals of long pulse width, generating control signals for a second pass gate in response to said leading edge transition, said control signals being generated a predetermined time after said leading edge transition by a second delay unit.

10. A pulse signal detector comprising:

first trapping means for transmitting to an output terminal an input signal resulting from a first polarity transition signal applied to an input terminal of said pulse signal detector, said first trapping means trapping a first resulting signal for a first predetermined period of time in response to first control signals on an output terminal of said pulse signal detector, wherein at least one of said first control signals has said first predetermined period of time with respect to said first polarity transition signal;

first control signal means for providing said first control signals in response to said first polarity transition;

second trapping means for transmitting to said output terminal an input signal resulting from a second polarity transition signal applied to said input terminal, said second trapping means trapping a second resulting signal for a second predetermined period of time in response to second control signals, wherein at least one of said second control signals having said second predetermined delay with respect to said second polarity transition signal; and second control signal means for providing said second control signals in response to said second polarity transition signal.

11. The pulse signal detector unit of claim 10 wherein said detector is implemented in integrated circuit technology.

12. The pulse signal detector unit of claim 11 wherein said first trapping means includes a pass gate component responsive to said first control signals, and wherein said second trapping means includes a second pass gate component responsive to said second control signals.

13. The pulse signal detector unit of claim 12 wherein said first control signal means includes a first delay component responsive to said first polarity transition signal for providing said first control signal with said first predetermined delay, wherein said second control means includes a second delay component for providing said second control signal with said second predetermined delay.

14. The pulse signal detector unit of claim 13 wherein said each delay component includes;

a first transistor coupled to ground;

second transistor coupled to a supply voltage;

a resistor coupled between said first transistor and said second transistor, wherein a input terminal is coupled to control terminals of said first and said second transistors;

a capacitor coupled in parallel with said first transistor; and an inverting amplifier having an input terminal coupled to a non-grounded capacitor terminal, an output terminal of said inverting amplifier being an output terminal of said delay unit.

15. The pulse detector unit of claim 10 wherein said first predetermined period and said second predetermined period are equal.

* * * * *